US008951905B2

(12) United States Patent  
Onozuka et al.

(10) Patent No.: US 8,951,905 B2  
(45) Date of Patent: Feb. 10, 2015

(54) SEMICONDUCTOR DEVICE AND PRODUCTION METHOD THEREOF

(71) Applicant: Kabushiki Kaisha Toshiba, Minato-ku (JP)

(72) Inventors: Yutaka Onozuka, Kanagawa (JP); Hiroshi Yamada, Kanagawa (JP); Kazuhiko Itaya, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/023,712

(22) Filed: Sep. 11, 2013

(65) Prior Publication Data

US 2014/0091447 A1    Apr. 3, 2014

(30) Foreign Application Priority Data

Oct. 1, 2012   (JP) ................................. 2012-219068

(51) Int. Cl.
*H01L 29/30*      (2006.01)
*H01L 23/48*      (2006.01)
*H01L 23/495*     (2006.01)
*H01L 21/78*      (2006.01)
*H01L 23/00*      (2006.01)
*H01L 23/498*     (2006.01)
*H01L 23/538*     (2006.01)
*H01L 23/31*      (2006.01)
*H01L 21/56*      (2006.01)

(52) U.S. Cl.
CPC .......... *H01L 23/49575* (2013.01); *H01L 21/78* (2013.01); *H01L 24/24* (2013.01); *H01L 24/82* (2013.01); *H01L 23/49838* (2013.01); *H01L 23/5389* (2013.01); *H01L 23/3121* (2013.01); *H01L 23/3135* (2013.01); *H01L 2224/48091* (2013.01); *H01L 2224/48465* (2013.01); *H01L 2224/49171* (2013.01); *H01L 21/561* (2013.01); *H01L 21/568* (2013.01); *H01L 2224/45144* (2013.01)
USPC ........................... 438/617; 257/738; 257/784

(58) Field of Classification Search
CPC .......... H01L 2924/01078; H01L 2924/01079; H01L 2924/01013; H01L 2924/01029; H01L 2924/14
USPC ......... 438/612–614, 617, 106, 107–109, 112, 438/113, 127, 124; 257/737–738, 676, 678, 257/780–781, 784, 788
See application file for complete search history.

(56) References Cited

U.S. PATENT DOCUMENTS

2006/0163722 A1*  7/2006  Hsu ............................... 257/737
2007/0273018 A1   11/2007 Onozuka et al.
2013/0234308 A1   9/2013  Yamada et al.

FOREIGN PATENT DOCUMENTS

JP          2013-214540 A       10/2013

* cited by examiner

*Primary Examiner* — Hoa B Trinh
(74) *Attorney, Agent, or Firm* — Oblon, Spivak, McClelland, Maier & Neustadt, L.L.P.

(57) ABSTRACT

A semiconductor device according to an embodiment includes: a first unit device configured to include a semiconductor chip, a backside electrode that is in contact with a backside of the semiconductor chip, and a bonding wire in which one end is connected to the backside electrode; a second unit device configured to have a function different from that of the first unit device; a resin layer configured to fix the first and second unit devices to each other; and a first wiring that is formed on the resin layer on a surface side of the semiconductor chip and connected to the other end of the bonding wire.

10 Claims, 13 Drawing Sheets

FIG.13B

SEMICONDUCTOR DEVICE AND PRODUCTION METHOD THEREOF

CROSS-REFERENCE TO RELATED APPLICATION

This application is based upon and claims the benefit of priority from Japanese Patent Application No. 2012-219068, filed on Oct. 1, 2012, the entire contents of which are incorporated herein by reference.

FIELD

Embodiments described herein relate generally to a semiconductor device and a production method thereof.

BACKGROUND

With the coming of ubiquitous society, there is increasing expectation for compact electronic apparatus, such as a mobile phone and a PDA, which are representatives of a mobile information terminal having wireless communication function. Therefore, the more compact, lighter-weight electronic apparatus are being developed. In the future, a demand for multiple functions and technical advantages is expected to increase in order to meet various needs.

In the wireless communication apparatus, it is necessary to combine an LSI chip and a different type device such as a passive component. In order to satisfy the needs, because there is a limit in improvement of a single device performance, and it is necessary to integrate the devices having different performance.

However, for example, the device having a function of a passive component is hardly formed on the LSI chip. In a method for integrating the LSI chip and the passive component on a substrate, there is a problem in that integration density is low. Therefore, there is a demand for a technology of integrating different type devices including the passive component and the LSI chip with high density to form one chip.

A method for integrating the different type devices are roughly divided into two. One of the methods is called system on chip (SOC) in which the integration is achieved by directly forming all the devices on one chip.

In the method, high device integration is implemented, and scaling-down of global wiring between the devices is also performed because all the devices are formed on one chip. Therefore, the high integration, high performance, and a low-profile package can be implemented.

However, there is a limitation to the device that can be integrated in the method. For example, the device made of a crystalline material such as a gallium arsenide is hardly formed on a silicon substrate because of a difference in lattice constant and a difference in thermal expansion coefficient.

It is not efficient that the device, such as an LSI, in which a small design rule is required and the device formed by a large design rule are made through the same process. Particularly, because all the processes are need to be changed in incorporating a new device, unfortunately cost increases in developing the new device, and a development time is lengthened.

The other method is called a system in package (SIP). In the system in package, the chips are separately formed, and the chips are mounted on a substrate called an interposer. In the method, because the device is individually formed, there is no limitation to the device. Because the existing chip can be used in developing the new system, the development cost is reduced and the development time can be shortened.

As to a problematic point, because the interposer and the chip are connected by a bonding wire or a bump, the highly dense chip arrangement, the scaling-down of the wiring, and the thin package are hardly implemented.

New integration technologies have been proposed in order to solve the problems. For example, after the different type devices formed by individual producing technologies are inspected and selected, the different type devices are disposed on a wafer and formed as a reconstruction wafer. Then a re-wiring layer including an insulating layer and a small design rule wiring is formed through a leading-edge semiconductor process. In the technology, unlike the existing SIP, the necessity to use the interposer substrate is eliminated, and the devices can be connected using the small design rule wiring through the semiconductor process. Therefore, the high integration can be implemented.

Unlike the existing SOC, the different type devices can be combined. Accordingly, the existing device can be used in constructing the new system, and the development time is shortened. As a result, the development cost can be reduced.

DETAILED DESCRIPTION

A semiconductor device according to an embodiment includes: a first unit device configured to include a semiconductor chip, a backside electrode that is in contact with a backside of the semiconductor chip, and a bonding wire in which one end is connected to the backside electrode; a second unit device configured to have a function different from that of the first unit device; a resin layer configured to fix the first and second unit devices to each other; and a first wiring that is formed on the resin layer on a surface side of the semiconductor chip and connected to the other end of the bonding wire.

In highly integrating different type devices, some commercial semiconductor chips are hardly obtained in a form of a bare chip. Therefore, the some commercial semiconductor chips can be obtained only in the form of a semiconductor package in which the bare chip is sealed. For this reason, an occupied area is enlarged even if a new integration technology is used, and the different type devices are hardly integrated as a sufficiently small semiconductor module.

Additionally, for an electronic device including a ground electrode on a backside, unfortunately it is difficult to perform wiring to the ground electrode.

As used herein, the "electronic device (or also simply referred to as a device)" is a concept that includes electronic components such as a semiconductor package, a chip-scale package (CSP), a semiconductor chip, and a passive component.

The "semiconductor chip" means a semiconductor piece that is formed by cutting a silicon wafer in which an integrated circuit is formed on a surface. The "semiconductor chip" is also referred to as a bare chip.

The "semiconductor package" means a product in a state in which the semiconductor chip is sealed by molding resin or the like. The "semiconductor package" includes packages generally called an LSI package, an IC package and the like.

The "unit device" means an individual device when a hybrid device is formed using the different type devices. For example, the "unit device" means the CSP in which the "semiconductor package" is worked by grinding, the "semiconductor chip" itself, or the passive component.

An "I/O electrode" means an input/output electrode that is provided in the electronic device. For example, the "I/O electrode" is formed during a semiconductor chip forming process, and is a pad electrode that is made of such a material as aluminum, an aluminum alloy, titanium, or a titanium alloy. For example, the "I/O electrode" is a metallic terminal, such as a lead, which is used to apply a voltage to the passive component.

The "bonding wire" is a wire that connects the pad electrode provided in the semiconductor chip and the backside electrode or a lead frame of the semiconductor package. The bonding wire includes a metallic ball unit (ball electrode) formed on the pad electrode during the formation of the bonding wire and a linear wire unit. For the sake of convenience, the state in which the "bonding wire" is separated by surface grinding is also referred to as the "bonding wire".

An embodiment will be described below with reference to the drawings. In the drawings, the identical or similar part is designated by the identical or similar reference numeral.

The semiconductor device of the embodiment includes: a first unit device configured to include a semiconductor chip, a backside electrode that is in contact with a backside of the semiconductor chip, and a bonding wire in which one end is connected to the backside electrode; a second unit device configured to have a function different from that of the first unit device; a resin layer configured to fix the first and second unit devices to each other; and a first wiring that is formed on the resin layer on a surface side of the semiconductor chip and connected to the other end of the bonding wire.

The configuration of the semiconductor device of the embodiment can establish electric connection on an electronic device surface side with respect to a wire unit of the bonding wire connected to the backside electrode. Accordingly, the wire through which the voltage is applied to the backside electrode of the electronic device is easily formed in combining the different type devices.

Figure 1A:
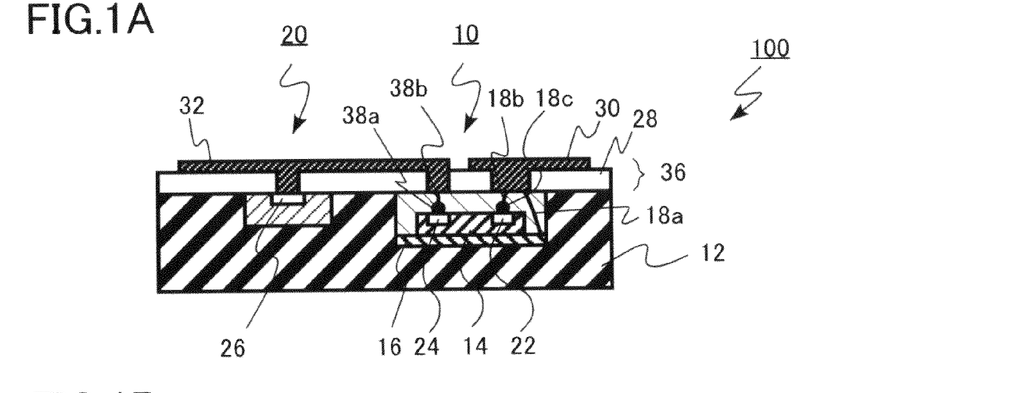
FIGS. 1A to 1C are schematic diagrams illustrating a semiconductor device according to an embodiment.
Figure 1B:
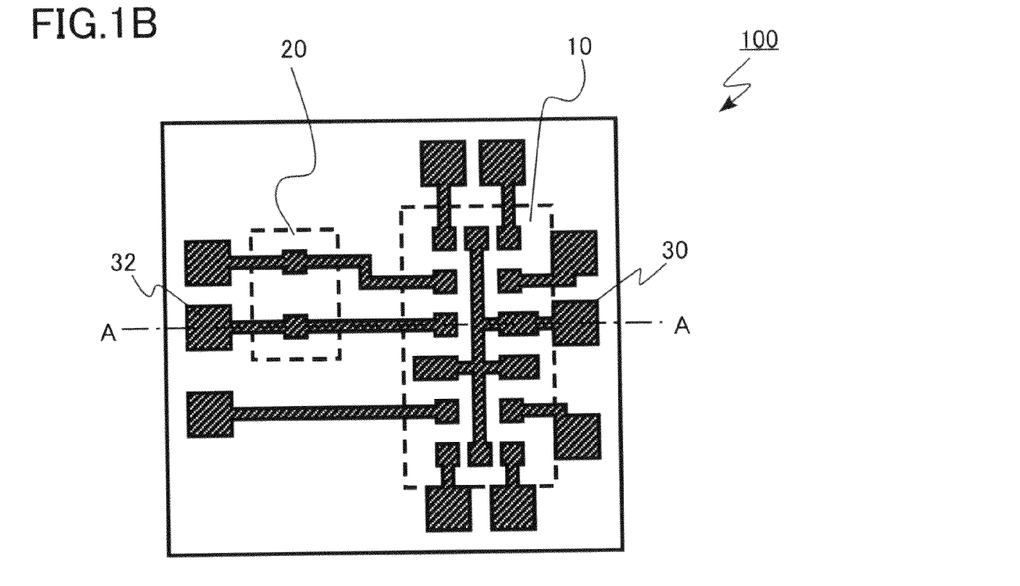
Figure 1C:
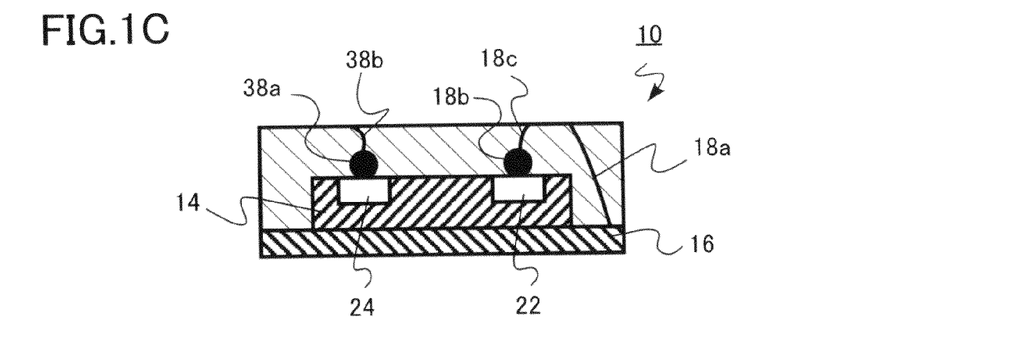

FIGS. 1A to 1C are schematic diagrams illustrating the semiconductor device of the embodiment. FIG. 1A is a sectional view of the semiconductor device, FIG. 1B is a plan view of the semiconductor device, and FIG. 1C is an enlarged view of a first unit device. FIG. 1A is a sectional view taken along a line A-A of FIG. 1B.

A semiconductor device 100 of the embodiment is the hybrid device in which a first unit device 10 and a second unit device 20 are fixed to each other using an organic resin layer 12. A surface of the first unit device 10 is substantially flush with a surface of the second unit device 20.

The first unit device 10 is an active component. For example, the first unit device 10 is an electronic device including a semiconductor chip 14 that is of an LSI chip, a backside electrode 16 that is in contact with a backside of the semiconductor chip 14, and a wire unit 18a of a bonding wire in which one end is connected to the backside electrode 16. The first unit device 10 is what is called a chip-scale package (CSP) that is made into a size close to the semiconductor chip 14 by grinding the surface of the semiconductor package and by cutting a side surface.

The side on which the integrated circuit or the pad electrode of the semiconductor chip 14 is formed is referred to as the surface of the semiconductor chip 14, and the opposite side is referred to as the backside of the semiconductor chip 14.

For example, the semiconductor chip 14 is the electronic device that is formed with silicon as a substrate.

The semiconductor chip 14 includes a first pad electrode 22 and a second pad electrode 24 in the surface of the semiconductor chip 14. Before the first unit device 10 is worked from the semiconductor package, a metallic ball unit 18b connected to the wire unit 18a and a wire unit 18c connected to the ball unit 18b are formed on the first pad electrode 22. For example, the first pad electrode 22 is the pad electrode that is used to apply a ground potential. For example, the ground potential is also applied to the backside electrode 16.

A metallic ball unit 38a and a wire unit 38b connected to the ball unit 38a are formed on the second pad electrode 24. For example, the second pad electrode 24 is the pad electrode for an input/output signal of the semiconductor chip 14.

The semiconductor chip 14, the wire unit 18a, the ball unit 18b, the wire unit 18c, the ball unit 38a, the wire unit 38b are sealed using resin. The resin is molding resin that is used when the first unit device 10 is the semiconductor package.

The second unit device 20 has a function different from that of the first unit device 10. For example, the second unit device 20 is a passive component such as a capacitor, a resistor, and a coil. The second unit device 20 includes an I/O electrode 26.

The first unit device 10 and the second unit device 20 are fixed to each other by the resin layer 12. The resin layer 12 has a shape that covers the backsides of the first unit device 10 and the second unit device 20. There is no particular limitation to a material for the resin layer 12. For example, the resin layer 12 is made of epoxy resin.

A wiring layer 36 including an insulating layer 28, a first wiring 30, and a second wiring 32 is provided on the first unit device 10, the second unit device 20, and the resin layer 12. The wiring layer 36 is provided on the surface side of the semiconductor chip 14. The wiring layer 36 may be a multi wiring layer that is formed by a stacked structure of plural insulating layers and plural wirings.

A pad unit that constitutes the I/O electrode of the semiconductor device 100 is formed in an end portion of each of the first wiring 30 and the second wiring 32.

One end of the wire unit 18a of the bonding wire is connected to the backside electrode 16. The other end of the wire unit 18a is connected to the first wiring 30. Therefore, the voltage can be applied to the backside electrode 16 through the first wiring 30 and the wire unit 18a. For example, the voltage is the ground potential. Alternatively, for example, the voltage may be a power supply voltage such as Vcc.

At this point, as described above, preferably the first unit device 10 includes the first pad electrode 22 that is formed in the surface of the semiconductor chip 14, and the first wiring 30 is electrically connected to the first pad electrode 22. A device operation is stabilized because a potential, for example, the ground potential is commonly provided to the backside electrode 16 and the semiconductor chip 14.

At this point, desirably the first unit device 10 includes the metallic ball unit 18b and the wire unit 18c connected to the metallic ball unit 18b on the first pad electrode 22, and the first wiring 30 is in contact with not the ball unit 18b but the wire unit 18c to be electrically connected to the first pad electrode 22. In forming the first unit device 10, when the surface grinding is performed such that the ball unit 18b is exposed, an area of a metallic portion exposed to the surface fluctuates largely due to a process variation. Therefore, possibly a contact resistance with the first wiring 30 varies.

On the other hand, when the exposure is performed while aimed at the wire unit 18c, a process margin of the surface grinding increases to decrease the variation of the area of the exposed metallic portion. Accordingly, the variation in contact resistance with the first wiring 30 can be controlled.

As described above, the semiconductor chip 14 includes the second pad electrode 24 formed on the surface of the semiconductor chip 14. The second unit device 20 includes the I/O electrode 26. The second wiring 32 electrically connects the second pad electrode 24 and the I/O electrode 26. The combined different type devices are connected to each other by the wiring layer 36, whereby the semiconductor device 100 acts as the one hybrid device.

Figure 2A:
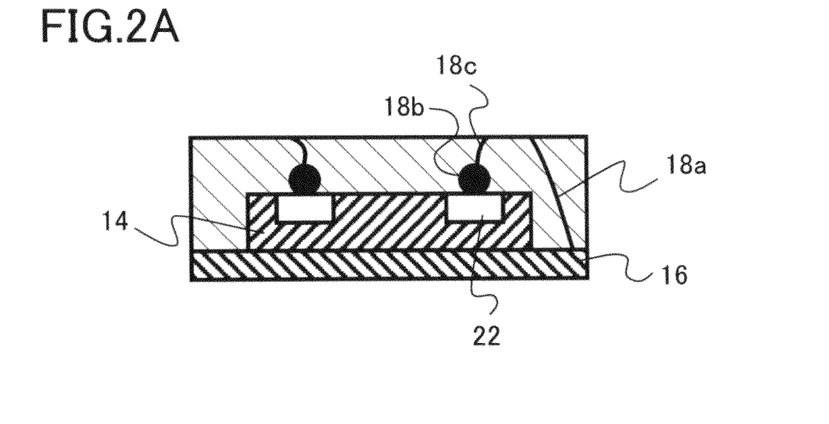
FIGS. 2A and 2B are explanatory views of function of the embodiment.
Figure 2B:
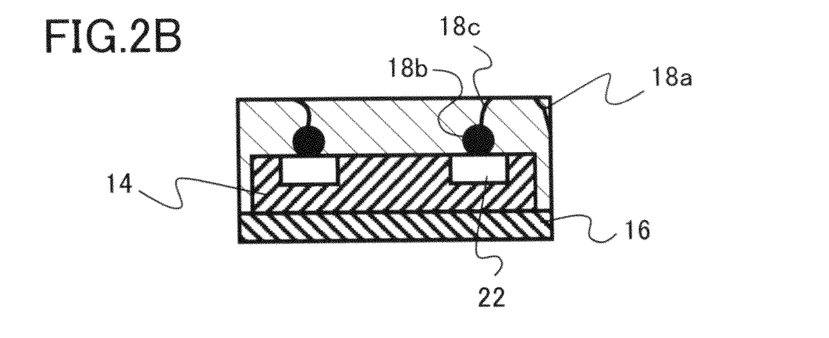

FIGS. 2A and 2B are explanatory views of function of the embodiment; FIG. 2A illustrates the unit device of the embodiment, and FIG. 2B illustrates a unit device of a comparative example.

For example, in the case that the semiconductor package including the semiconductor chip 14 is worked to make the unit device including the semiconductor chip 14, desirably the unit device has a finished dimension as small as possible from the viewpoint of reducing the area of the hybrid device. Therefore, when the semiconductor package is worked by dicing, desirably a region as close to an end portion of the semiconductor chip 14 as possible is cut by the dicing or the like.

However, as illustrated in FIG. 2B, when the region is ground up to a connection portion of the wire unit 18a and the backside electrode 16, the potential is hardly applied to the backside electrode 16. Therefore, the backside electrode 16 is used as a floating potential without providing the potential, or the wiring, such as a via plug, which reaches the backside electrode 16 from the surface side of the semiconductor chip 14, is separately formed after the unit devices are combined. In the former case, there is a risk that an operation of the semiconductor device 100 becomes unstable. In the latter case, the process of forming the semiconductor device 100 becomes complicated, which leads to degradation of a product yield or an increase of production cost.

In the embodiment, as illustrated in FIG. 2A, the structure in which the connection portion of the wire unit 18a and the backside electrode 16 is retained in the unit device solves the problems of the floating potential and the wiring formation.

A method for producing the semiconductor device of an embodiment will be described below. The semiconductor device producing method of the embodiment includes: preparing plural semiconductor packages in each of which a semiconductor chip, a backside electrode being in contact with a backside of the semiconductor chip, and a bonding wire connecting a first pad electrode on the semiconductor chip and the backside electrode are sealed using resin; disposing the plural semiconductor packages on a substrate to bond the plural semiconductor packages; grinding the semiconductor package from a surface side of the semiconductor chip to expose the bonding wire; separating the plural semiconductor packages by cutting (or grinding) surroundings of the plural semiconductor packages such that a contact portion between the bonding wire and the backside electrode is left on a side of the semiconductor chip, and forming plural first unit devices; preparing a second unit device having a function different from that of the first unit device; sealing the first unit device and the second unit device side by side using resin; and forming a first wiring on the first unit device, the first wiring being connected to an first end portion of the bonding wire exposed by the grinding, the first end portion of the bonding wire being located on a side connected to the backside electrode.

FIGS. 3A and 3B to FIGS. 7A and 7B are schematic diagrams illustrating the method for producing the semiconductor device of the embodiment. FIGS. 3A, 4A, 5A, 6A, and 7A are sectional views. FIGS. 3B, 4B, 5B, 6B, and 7B are plan views illustrating one device.

FIGS. 3A and 3B to FIGS. 7A and 7B illustrate the producing method in making the first unit device 10 in FIGS. 1A to 1C from the semiconductor package. The first unit device 10 made from the semiconductor package is also referred to as the chip-scale package (CSP).

Figure 3A:
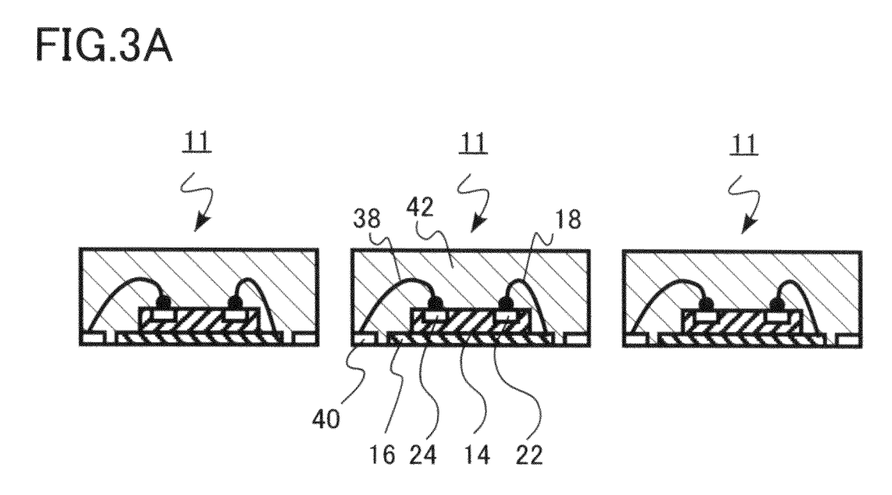
FIGS. 3A and 3B are schematic diagrams illustrating a method for producing the semiconductor device of the embodiment.
Figure 3B:
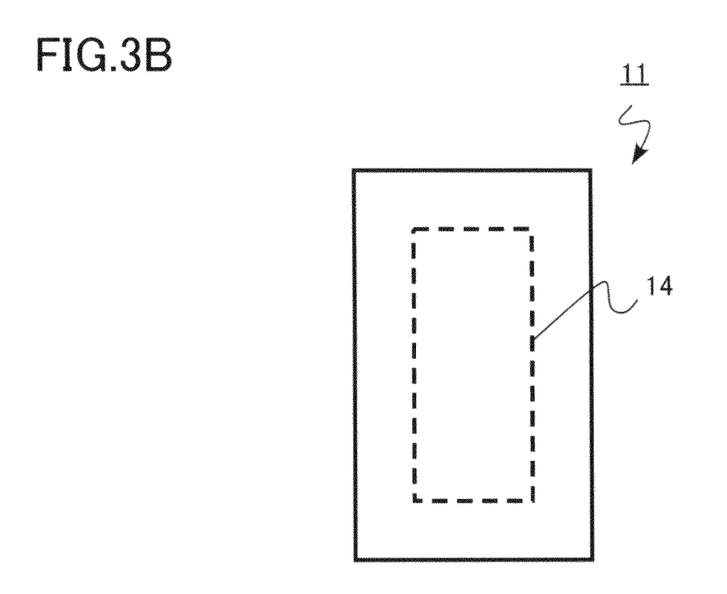

As illustrated in FIGS. 3A and 33, plural semiconductor packages 11 in each of which the semiconductor chip 14, the backside electrode 16 that is in contact with the backside of the semiconductor chip 14, and the bonding wire 18 that connects the first pad electrode 22 and the backside electrode 16 on the semiconductor chip 14 are sealed using the resin are prepared.

The semiconductor chip 14 is connected to the backside electrode 16 through the pad electrode 22 by the bonding wire 18 made of gold (Au) and the like. The semiconductor chip 14 is electrically connected to a signal terminal 40 of the lead frame through the pad electrode 24 by the bonding wire 38. The semiconductor chip 14 and the bonding wires 18 and 38 are sealed by a molding resin (sealing resin) 42.

Figure 4A:
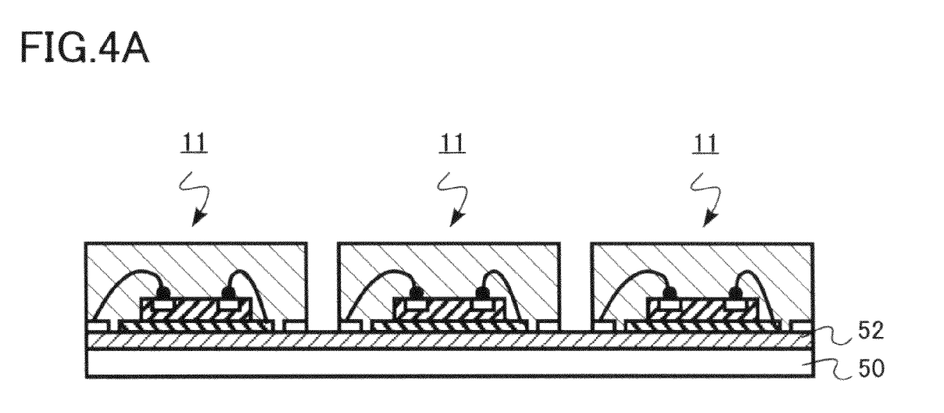
FIGS. 4A and 4B are schematic diagrams illustrating the method for producing the semiconductor device of the embodiment.
Figure 4B:
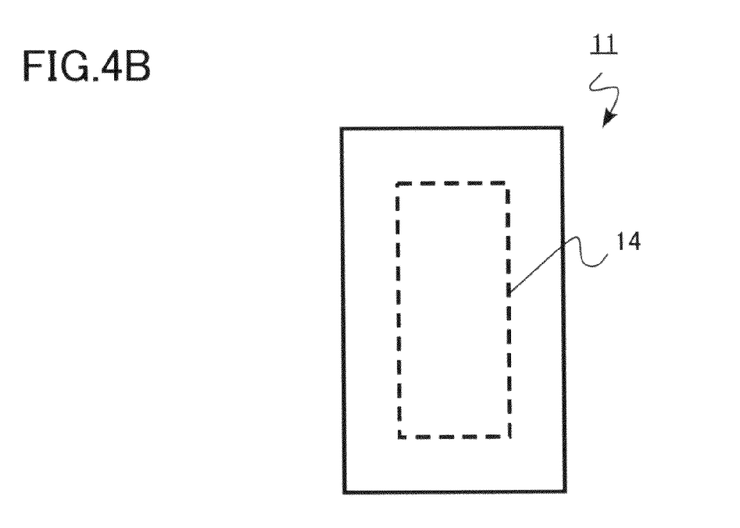

Then, as illustrated in FIGS. 4A and 4B, for example, a substrate 50 made of transparent glass or silicon is prepared. For example, the substrate 50 has a wafer shape.

Then the plural semiconductor packages 11 are tow-dimensionally arrayed on an adhesive layer 52 formed on the substrate 50. For example, the plural semiconductor packages 11 are arrayed with a chip mounter or a flip chip bonder. For example, a bonding agent may be used instead of the adhesive layer 52.

Figure 5A:
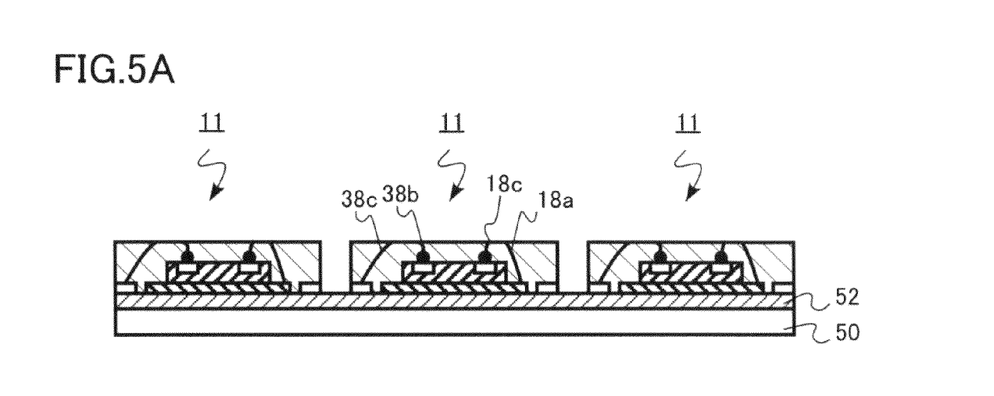
FIGS. 5A and 5B are schematic diagrams illustrating the method for producing the semiconductor device of the embodiment.

Then, as illustrated in FIG. 5A, the surfaces of the plural semiconductor packages 11 are ground from the surface side of the semiconductor chip 14 by a machine grinding method.

For example, before the grinding, a gap between the semiconductor packages 11 may be sealed and fixed using the resin by a printing method or the like.

At least the wire units of the bonding wires 18 and 38 are exposed to the surface by the grinding. Therefore, the wire unit of the bonding wire 18 is divided into the wire unit 18a and the wire unit 18c, and the wire unit of the bonding wire 38 is divided into the wire unit 38b and the wire unit 38c. The surface grinding can also be performed until the ball units of the bonding wires 18 and 38 are exposed.

Figure 5B:
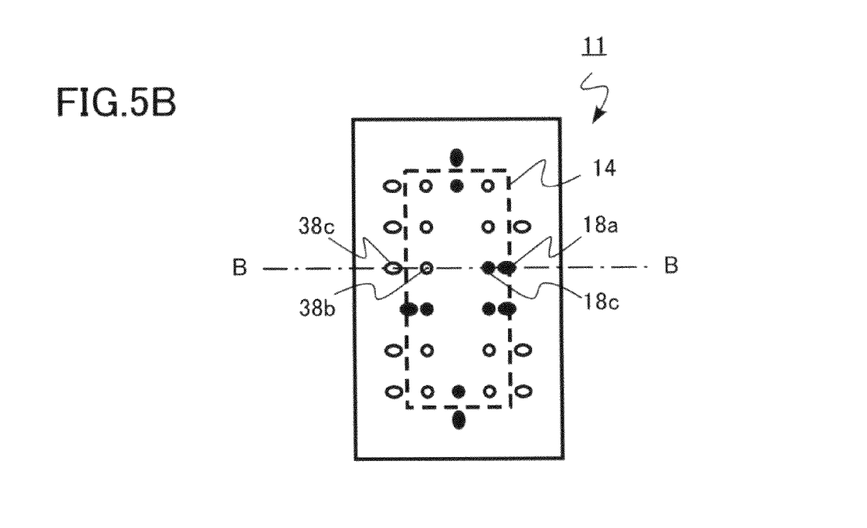

FIG. 5B illustrates an exposed portion of the bonding wire. For example, black circle and black ellipse portions indicate the bonding wire at the ground potential, and white circle and white ellipse portions indicate the input/output signal bonding wire. FIG. 5A is a sectional view taken along a line B-B of FIG. 5B.

At this point, in order to stabilize the area of the metallic portion exposed to the surface, desirably the grinding is performed such that the metallic ball units 18b and 38a of bonding wires 18 and 38 are not exposed.

Desirably the machine grinding is performed using a grinding stone of #600 or more from the viewpoint of ensuring a flat polishing surface. Desirably the surface is polished to ensure surface flatness using a polishing sheet that contains a polishing solution containing alumina particles having a particle diameter of 1 µm.

Figure 6A:
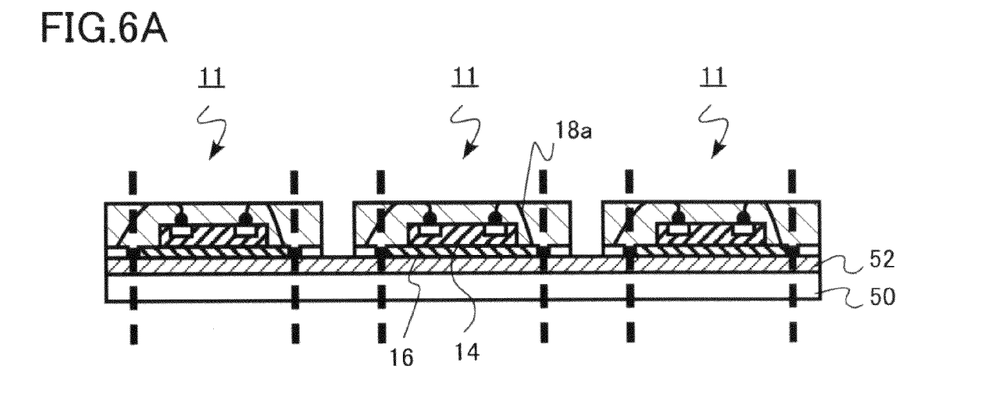
FIGS. 6A and 6B are schematic diagrams illustrating the method for producing the semiconductor device of the embodiment.
Figure 6B:
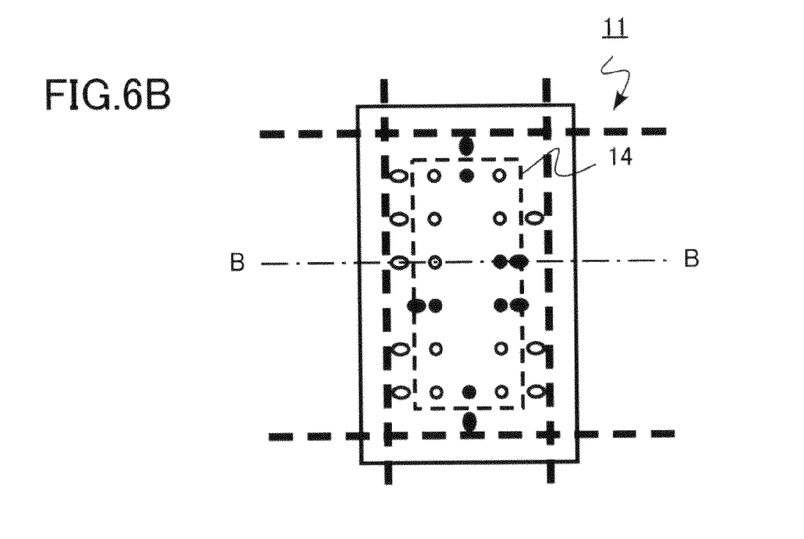

Then, as indicated by bold dashed lines in FIGS. 6A and 6B, surroundings of the plural semiconductor packages 11 are cut such that the contact portion between the bonding wire 18a and the backside electrode 16 is left on the side of the semiconductor chip 14.

Figure 7A:
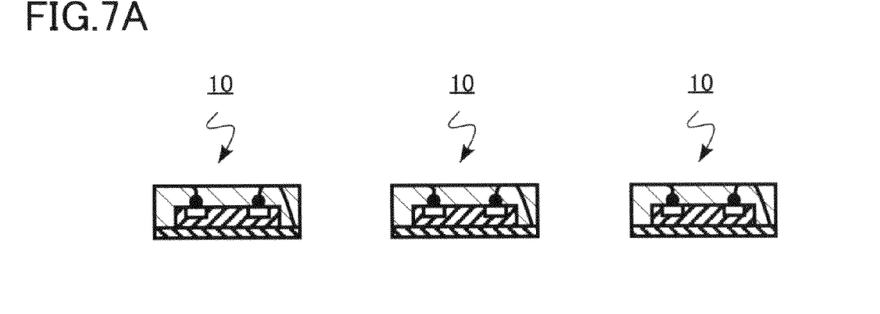
FIGS. 7A and 7B are schematic diagrams illustrating the method for producing the semiconductor device of the embodiment.
Figure 7B:
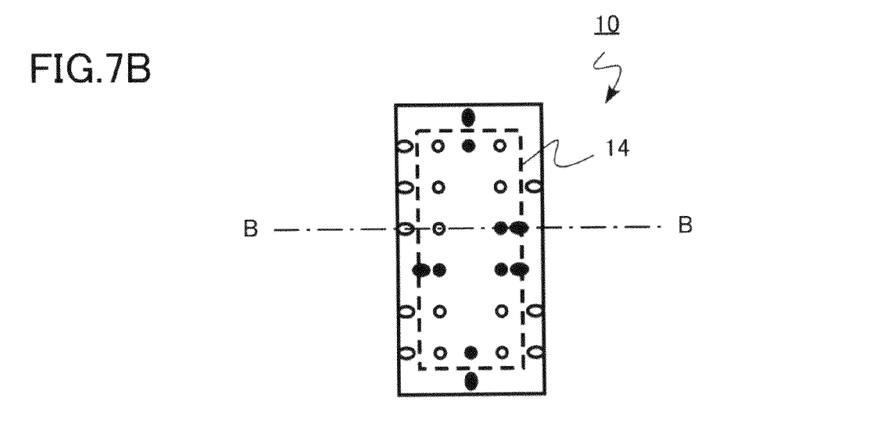

As illustrated in FIGS. 7A and 7B, after the cutting, the device is peeled from the adhesive layer 52 and individualized (or separated), thereby forming the plural first unit devices 10. That is, the substrate 50 in which the plural semiconductor packages 11 are collected is divided with a dicer to form the first unit devices 10.

Therefore, the CSP in which the voltage is easily applied to the backside electrode 16 and which has the substantially same size as the semiconductor chip 14 is constructed.

In the embodiment, as is clear from FIG. 7B, the four bonding wires (black ellipse portions in FIG. 7B) connected to the backside electrode 16 are left in the first unit device 10. Desirably the improvement of reliability in the application of the voltage to the backside electrode 16, the improvement of the yield, and the decrease in connection resistance can be implemented by leaving the plural bonding wires connected to the backside electrode 16.

Figure 8A:
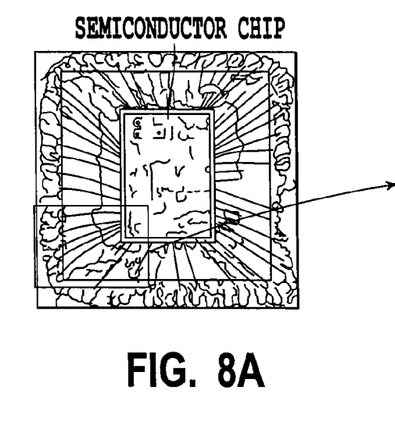
FIGS. 8A and 8B are photographs of an exploded semiconductor package.
Figure 8B:
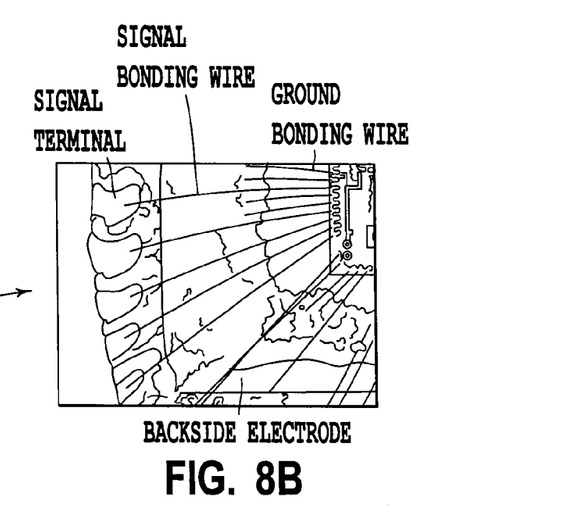

FIGS. 8A and 8B are photographs of an actually exploded semiconductor package. FIG. 8B is an enlarged photograph of a rectangular frame in FIG. 8A. The semiconductor chip and the signal terminal are connected to each other by the signal bonding wire. The semiconductor chip and the backside electrode are also connected to each other by the ground bonding wire. The bonding wire is the gold (Au) wire. The signal terminal and the backside electrode constitute the lead frame.

Figure 9A:
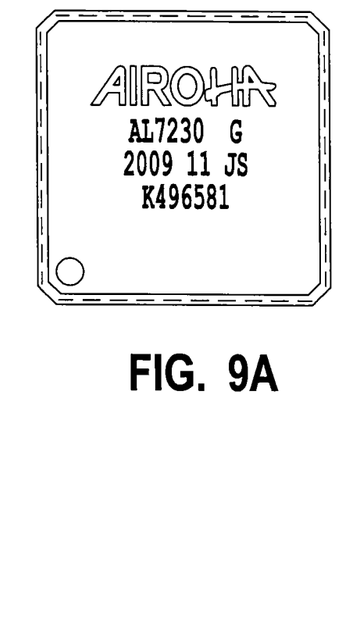
FIGS. 9A and 9B are photographs illustrating an upper surface of the semiconductor package before and after grinding.
Figure 9B:
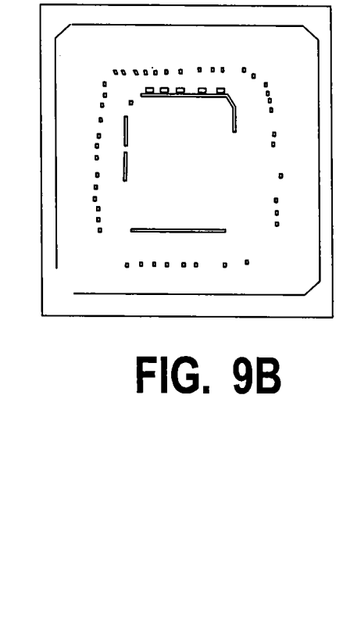
Figure 9C:
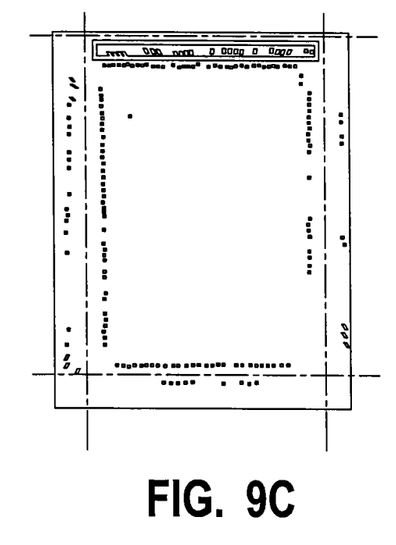
FIGS. 9C and 9D are photographs illustrating a side surface of the semiconductor package before and after cutting.
Figure 9D:
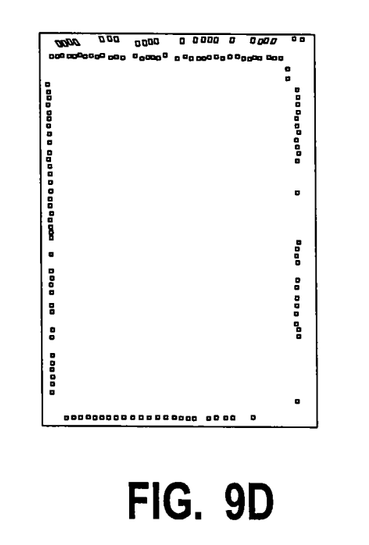

FIGS. 9A and 9D are photographs illustrating an upper surface of the actual semiconductor package before and after grinding, and FIGS. 9C and 9D are photographs illustrating a side surface of the actual semiconductor package before and after cutting. FIG. 9A is a photograph of the semiconductor package before the surface is ground. FIG. 9B is a photograph of the semiconductor package after the surface is ground. It is found that the bonding wire is exposed to the surface. FIG. 9C is an enlarged photograph of the semiconductor package after the surface is ground. An alternate long and short dash line indicates a line to be cut by the dicing. An inside of a white frame indicates the exposed portion of the bonding wire connected to the backside electrode. FIG. 9D is a photograph of the CSP made by the dicing.

Figure 11A:
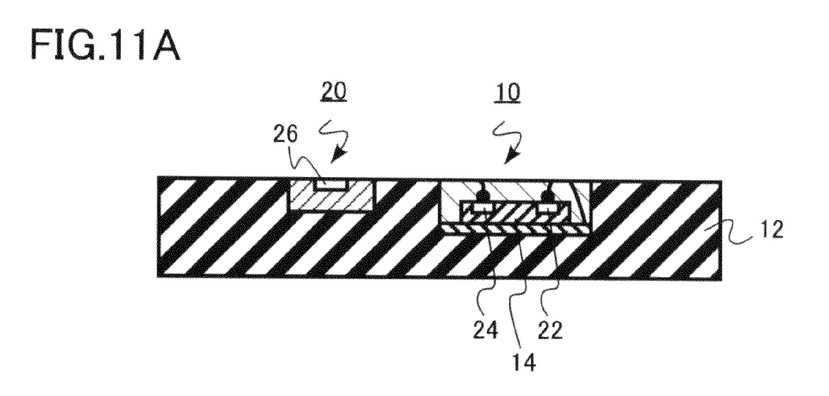
FIGS. 11A and 11B are schematic diagrams illustrating the method for producing the semiconductor device of the embodiment.
Figure 11B:
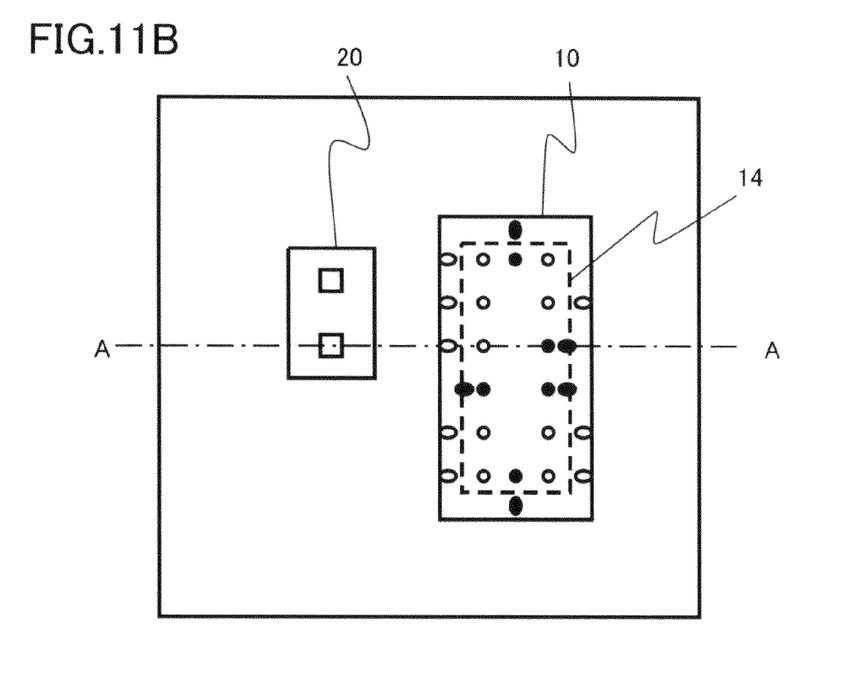
Figure 12A:
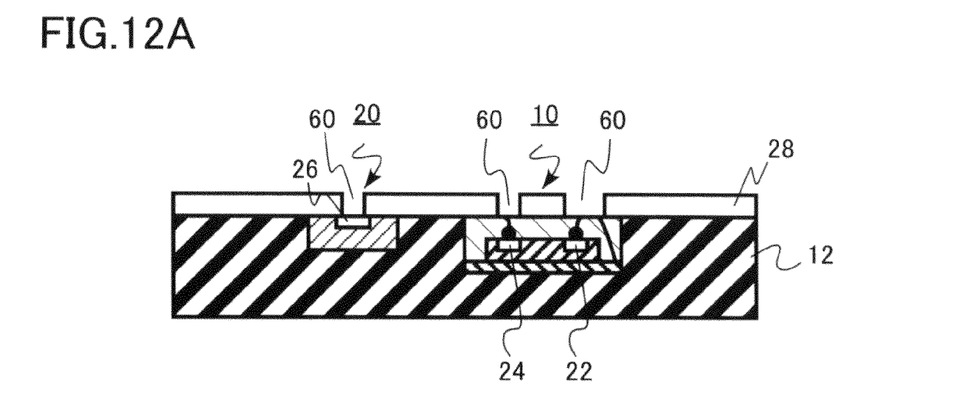
FIGS. 12A and 12B are schematic diagrams illustrating the method for producing the semiconductor device of the embodiment.
Figure 12B:
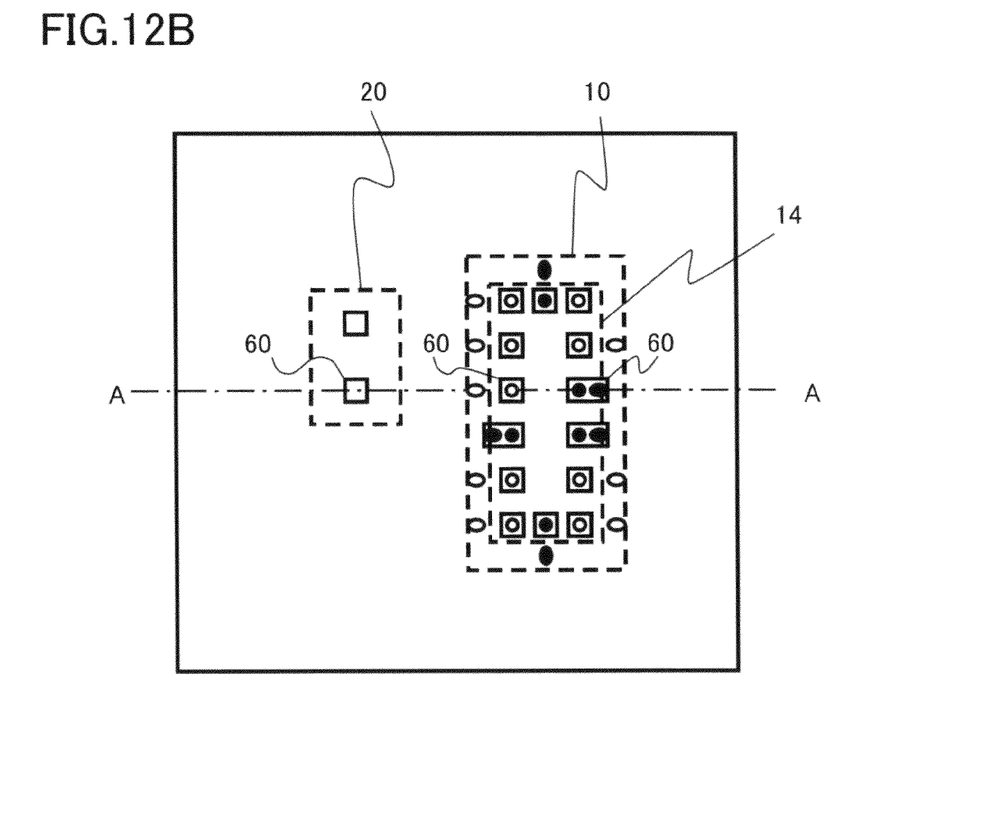
Figure 13A:
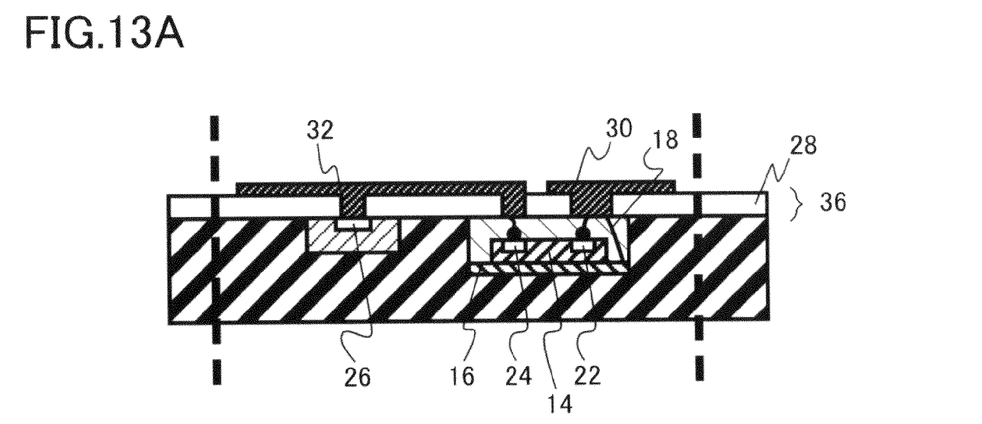
FIGS. 13A and 13B are schematic diagrams illustrating the method for producing the semiconductor device of the embodiment.
Figure 13B:
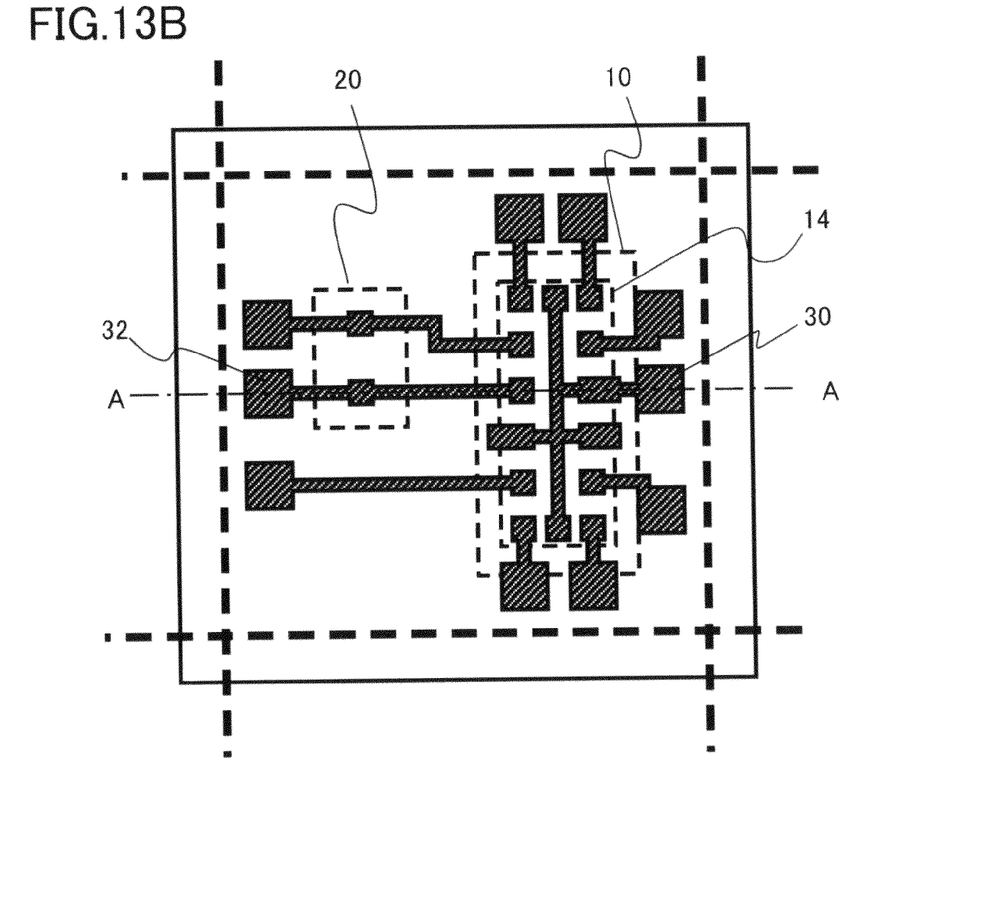

FIG. 10 to FIGS. 13A and 13B are schematic diagrams illustrating the method for producing the semiconductor device of the embodiment. FIGS. 10, 11A, 12A, and 13A are sectional views. FIGS. 11B, 12B, and 13B are plan views.

FIG. 10 to FIGS. 13A and 13B illustrate the producing method when the first unit device 10 and the second unit device 20 are combined to make the semiconductor device 100.

Figure 10:
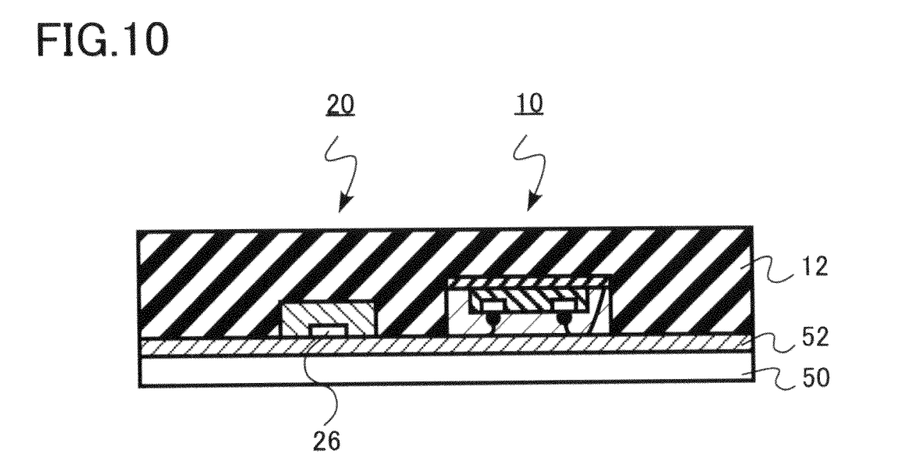
FIG. 10 is a schematic diagram illustrating the method for producing the semiconductor device of the embodiment.

As illustrated in FIG. 10, the first unit device 10 and the second unit device 20 having the function different from that of the first unit device 10 are prepared. For example, the second unit device 20 is the passive component such as the capacitor, the resistor, and the coil. The second unit device 20 includes the I/O electrode 26 for input/output.

The substrate 50 made of transparent glass or silicon is prepared. For example, the substrate 50 has the wafer shape.

Then the plural first unit devices 10 and the plural second unit devices 20 are two-dimensionally arrayed on the adhesive layer 52 formed on the substrate 50. At this point, the first unit devices 10 and the second unit devices 20 are arrayed on the substrate 50 such that the surface sides of the first unit devices 10 and the second unit devices 20, namely, the pad electrode and the I/O electrode 26 become the side of the substrate 50. FIG. 10 to FIGS. 13A and 13B illustrate the section of only one set of the first unit device 10 and the second unit device 20.

For example, the first unit devices 10 and the second unit devices 20 are arrayed with the chip mounter or the flip chip bonder. For example, the bonding agent may be used instead of the adhesive layer 52.

Then, the arrayed first unit devices 10 and second unit devices 20 are fixed to each other using the organic resin layer 12. For example, the resin layer 12 is formed by sealing the first unit devices 10 and second unit devices 20 using the epoxy resin with a vacuum printing apparatus.

Then, as illustrated in FIGS. 11A and 11B, after the resin layer 12 is cured, the fixed first unit devices 10 and second unit devices 20 are peeled from the adhesive layer 52 on the substrate 50. FIG. 11A is a sectional view taken along a line A-A of FIG. 11B.

Then the wiring layer is formed on the first unit device 10, the second unit device 20, and the resin layer 12 using the well-known semiconductor process. As illustrated in FIGS. 12A and 12B, the insulating layer 28 is formed on the first unit device 10, the second unit device 20, and the resin layer 12. Openings 60 are provided on the exposed portions of the bonding wires 18 and 38 and I/O electrode 26 in the insulating layer 28.

As illustrated in FIGS. 13A and 13B, the first wiring 30 and the second wiring 32 are formed using the well-known semiconductor process. The wiring layer 36 is formed by the insulating layer 28, the first wiring 30, and the second wiring 32.

The openings 60 provided in the insulating layer 28 are filled with the first wiring 30 and the second wiring 32. For example, the first wiring 30 and the second wiring 32 are made of metal such as aluminum (Al), copper (Cu), titanium (Ti), titanium nitride (TiN), an alloy thereof, or a stacked structure thereof.

On the first unit device 10, the first wiring 30 is connected to the first end portion of the bonding wire 18 exposed by the grinding on the side connected to the backside electrode 16. As illustrated in FIG. 13A, from the viewpoint of stabilizing the ground potential in the semiconductor chip 14, desirably the first wiring 30 is formed so as to be connected to the second end portion of the bonding wire 18 exposed by the grinding on the side of the first pad electrode 22.

The second wiring 32 electrically connects the second pad electrode 24 and the I/O electrode 26.

The first wiring 30 is commonly used by the I/O electrode (pad electrode) and backside electrode 16, which should be connected to the ground potential of the semiconductor chip 14. Accordingly, the ground potential of the semiconductor chip 14 is stabilized.

Then the substrate is divided along the line to be diced as indicated by the bold dashed line in FIGS. 13A and 13B, thereby forming the semiconductor device 100 in which the different type devices are combined, illustrated in FIG. 1.

As described above, the embodiment can provide the highly-integrated, stable semiconductor device in which the different type devices are combined through the simple process, and the semiconductor device producing method.

In the embodiment, the second unit device is the passive component by way of example. However, the second unit device is not necessarily the passive component. For example, the second unit device may be active components such as a transistor and an LSI.

In the semiconductor chip, silicon is used as the substrate by way of example. Alternatively, the substrate may be other semiconductor substrates such as germanium and gallium arsenide.

While certain embodiments have been described, these embodiments have been presented by way of example only, and are not intended to limit the scope of the inventions. Indeed, the semiconductor device and the production method thereof described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first unit device including a semiconductor chip, a backside electrode in contact with a backside of the semiconductor chip, and a bonding wire in which one end is connected to the backside electrode;
    a second unit device having a function different from that of the first unit device;
    a resin layer fixing the first and second unit devices to each other; and
    a first wiring formed on the resin layer on a surface side of the semiconductor chip and connected to the other end of the bonding wire.

2. The device according to claim 1, wherein the semiconductor chip includes a first pad electrode formed on a surface of the semiconductor chip,
    and the first wiring is electrically connected to the first pad electrode.

3. The device according to claim 2, wherein the first unit device includes a metallic ball unit and a wire unit connected to the ball unit on the first pad electrode,
    and the first wiring is in contact with the wire unit to be electrically connected to the first pad electrode.

4. The device according to claim 1, wherein the backside electrode is a ground potential.

5. The device according to claim 1, wherein the semiconductor chip includes a second pad electrode that is formed on a surface of the semiconductor chip, the second unit device includes an I/O electrode,
    and the device comprises a second wiring formed on the first and second unit devices to electrically connect the second pad electrode and the I/O electrode.

6. A semiconductor device producing method comprising:
    preparing a plurality of semiconductor packages in each of which a semiconductor chip, a backside electrode being in contact with a backside of the semiconductor chip, and a bonding wire connecting a first pad electrode on the semiconductor chip and the backside electrode are sealed using resin;
    disposing the plurality of semiconductor packages on a substrate to bond the plurality of semiconductor packages;
    grinding the semiconductor package from a surface side of the semiconductor chip to expose the bonding wire;
    separating the plurality of semiconductor packages by cutting surroundings of the plurality of semiconductor packages such that a contact portion between the bonding wire and the backside electrode is left on a side of the semiconductor chip, and forming a plurality of first unit devices;
    preparing a second unit device having a function different from that of the first unit device;
    sealing the first unit device and the second unit device side by side using resin;
    and forming a first wiring on the first unit device, the first wiring being connected to a first end portion of the bonding wire exposed by the grinding, the first end portion of the bonding wire being located on a side connected to the backside electrode.

7. The method according to claim 6, wherein the first wiring is formed so as to be also connected to a second end portion of the bonding wire exposed by the grinding, the second end portion of the bonding wire being located on a side of the first pad electrode.

8. The method according to claim 7, wherein a metallic ball unit of the bonding wire on the first pad electrode is not exposed in grinding the semiconductor package.

9. The method according to claim 6, wherein the backside electrode is a ground potential.

10. The method according to claim 6, wherein the semiconductor chip includes a second pad electrode that is formed on a surface of the semiconductor chip, the second unit device includes an I/O electrode, and a second wiring that electrically connects the second pad electrode and the I/O electrode is formed on the first and second unit devices.

* * * * *